United States Patent [19]

Tsuzuki et al.

[11] Patent Number: 4,751,492
[45] Date of Patent: Jun. 14, 1988

[54] VARIABLE RESISTOR

[75] Inventors: Takayoshi Tsuzuki; Ryohei Yabuno; Masami Ishii, all of Toyota, Japan

[73] Assignee: Aisin Seiki Kabushiki Kaisha, Kariya, Japan

[21] Appl. No.: 52,904

[22] Filed: May 22, 1987

[30] Foreign Application Priority Data

May 23, 1986 [JP] Japan .................. 61-119622

[51] Int. Cl.⁴ .......................................... H01C 10/38
[52] U.S. Cl. .................. 338/176; 338/309; 338/314
[58] Field of Search ............... 338/162, 176, 308, 309, 338/314

[56] References Cited

U.S. PATENT DOCUMENTS

4,345,236 8/1982 Eichelberger et al. ......... 338/314 X
4,495,524 1/1985 Kakuhashi et al. .................. 338/314

Primary Examiner—C. L. Albritton
Attorney, Agent, or Firm—Oblon, Fisher, Spivak, McClelland & Maier

[57] ABSTRACT

A variable resistor for use in vehicles and electric apparatus having a resistive body whose resistance value is hardly affected by abrasion. The resistive body is composed of a lower resistive layer formed on the surface of a substrate and an upper resistive layer formed on said lower resistive layer, wherein said upper resistive layer has 2 to 500 times greater value of volume resistivity compared with said lower resistive layer.

5 Claims, 4 Drawing Sheets

OSCILLATION CYCLES (MILLION TIMES)

FIG. 11 (PRIOR ART)

VARIABLE RESISTOR

BACKGROUND OF THE INVENTION 1. (Field of the Invention)

The present invention relates to a variable resistor which is used for electric apparatus and vehicles.

2. (Description of the Prior Art)

Figure 11:
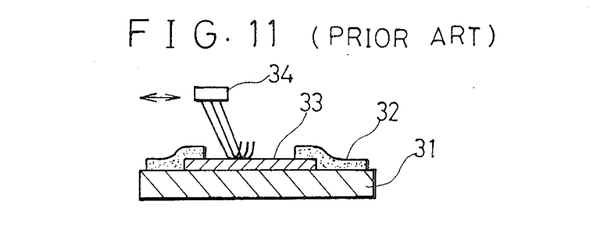
FIG. 11 shows a cross-sectional basic construction of a variable resistor of prior art.

FIG. 11 shows a typical conventional variable resistor which comprises a substrate 31, a resistive body 33 formed on said substrate, a pair of terminal electrodes 32 connecting each side of the resistive body 33 and a brush 34. As the resistive body, a carbon single layer or a metal single layer is used. These layers can be formed on substrates by a printing method, a vapor deposition method, or a pattern-draw-molding method.

SUMMARY OF THE INVENTION

It has been generally known that the resistive body of a variable resistor is gradually abraded as a brush slides on the surface thereof.

Variable resistors for electric apparatus and vehicles are required to have a high round durability. Especially the variable resistor for vehicles is required to have a higher round durability of some millions to hundred millions under a hard circumstance with respect to temperature and humidity. When a variable resistor is used under such a condition, there occurs a disadvantage of excessive abrasion of the resistive body as a brush slides thereon for many times. In a conventional variable resistor, a resistive body is composed of single resistive layer. Therefore, as the resistive body is abraded, resistance value of the resistive body increases, causing fluctuations in resistance value and ratio of divided voltages.

To overcome aforesaid disadvantage, the present invention has as one of its objects the provision of a variable resistor having a resistive body whose resistance value is hardly affected by abrasion.

Another object of the present invention is to provide a variable resistor having high durability.

To achieve aforesaid objects, a variable resistor of the present invention comprises a substrate, a resistive body composed of a lower resistive layer placed on the surface of said substrate and an upper resistive layer placed on said lower resistive layer, and a brush which slides on the surface of said upper resistive layer. The upper resistive layer has 2 to 500 times greater volume resistivity as compared with that of the lower resistive layer.

Figure 1:
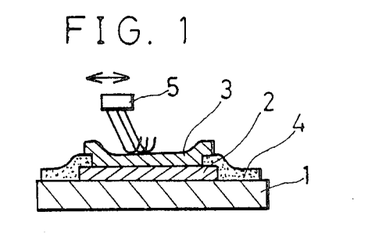
FIG. 1 is an explanatroy drawing of the basic construction of a variable resistor according to the present invention.

A basic construction of a variable resistor according to the present invention is shown in FIG. 1, wherein a lower resistive layer 2 is formed on a substrate 1 and terminal electrodes 4 are formed thereon. Further, an upper resistive layer 3 is formed on the lower resistive layer 2 where a brush 5 slides on the surface thereof.

Figure 2:
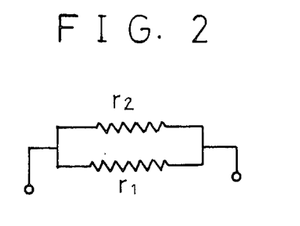
FIG. 2 shows an electric circuit of FIG. 1.

As shown in an electric circuit of FIG. 2, supposing that r1 is a resistance value of the lower resistive layer 2, r2 is a resistance value of the upper resistive layer 3 and combined resistance is r, r is formularized as;

$$r = r1 \cdot r2 / (r1 + r2)$$

and in the case where $r2 \gg r1$;

$$r1 + r2 \approx r2 \text{ then } r \approx r1 \cdot r2 / r2$$

$$r \approx r1$$

Hereinafter, theoretical change in resistance value caused by abrasion on a variable resistor will be explained specifically, comparing a variable resistor according to the present invention and a conventional variable resistor.

The resistive body of a typical variable resistor according to the present invention is presumed to comprise a lower resistive layer having 10 mm in length, 2 mm in width and 100 μm in thickness and an upper resistive layer formed on the lower resistive layer in the same size as the lower layer. The resistance r1 of the lower resistive layer is presumed to be 100Ω and the resistance ru of the upper resistive layer is presumed to be 1000Ω.

On the other hand, the resistive body of the conventional resistor is presumed to be a single layer of 10 mm in length, 2 mm in width and 200 μm in thickness. The resistance rc of the conventional resistor is presumed to be 182Ω.

Figure 3:
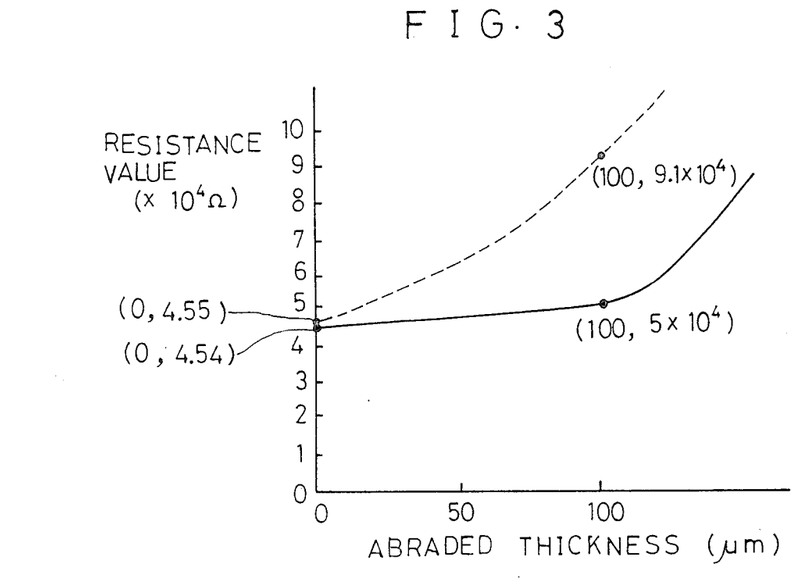
FIG. 3 shows a graph of theoretical changes in resistance value of a conventional variable resistor and the variable resistor of the present invention.

FIG. 3 shows theoretical change in resistance values of the aforesaid two resistors from their initial state to a state where the surface is abraded and reduced in thickness. The abscissa shows the abrasion thickness and the ordinate shows the resistance value. Also the solid line represents the variable resistor of the present invention and the broken line represents the conventional resistor.

According to the FIG. 3, when the abrasion thickness of the resistors is 100 μm, that is when the thickness of the total resistive layer is ½ to the initial state, the variable resistor of the present invention only changes its resistance value from $4.54 \times 10^4 \Omega$ to $5 \times 10^4 \Omega$ while the conventional resistor increases its value double from $4.55 \times 10^4 \Omega$ to $9.1 \times 10^4 \Omega$.

The variable resistor of the present invention is composed of a substrate, a resistive body, a terminal electrode and a brush. And for the substrate and the terminal electrode and the brush, the conventional ones may be used.

The substrate is for fixing the resistive body thereon and it may be formed with the electric insulating materials having the stable surface. Namely, plates of ceramics and synthetic resins may be used as the substrate.

The terminal electrode is formed at least one end of the resistive body but it is usually formed on the both ends. The terminal electrode acts to take out the flow current. In-Ag alloy may be used as a material forming the terminal.

The brush slides on the surface of the resistive body to be one of the electrode and to give the resistance value in proportion to the distance between the terminal at one end of the resistor and the brush. The bundle of metal wire may be used as the brush.

Figure 4:
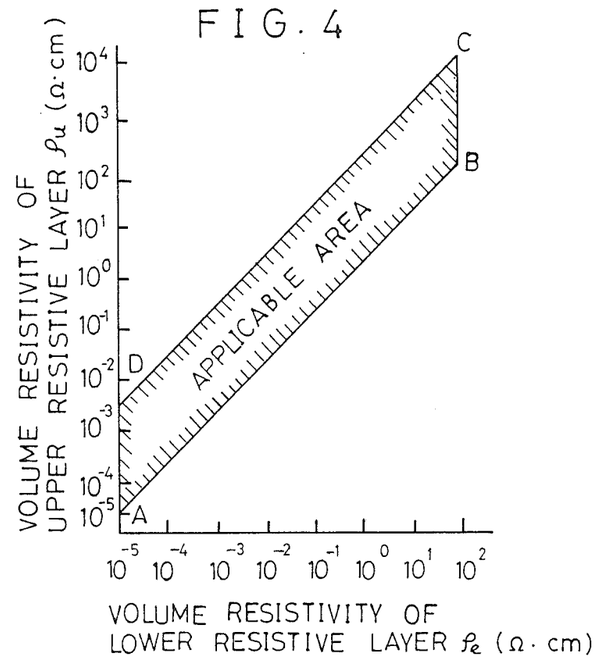
FIG. 4 shows a graph of applicable area of resistance values of resistive layers in the variable resistor according to the present invention.

The characteristic of the present invention resides in that the variable resistor has a resistive body composed of two layers which comprises the lower resistive layer having low volume resitivity $\rho e$ and the upper resistive layer having high volume resistivity $\rho u$. The applicable ranges of $\rho e$ and $\rho u$ of the two layers are shown in FIG. 4 as the area indicated by the points A, B, C, and D. The coordinates of the each point are shown as follows.

A $(1 \times 10^{-5}, 2 \times 10^{-5})$, B $(1 \times 10^2, 2 \times 10^2)$ C $(1 \times 10^2, 5 \times 10^4)$, D $(1 \times 10^{-5}, 5 \times 10^{-3})$.

Because the resistive body in the present invention comprises the lower resistive layer and the upper resistive layer, a fluctuation in resistance value of the resistive body is quite small. Further, the greater a difference in portion between the volume resistivity of the lower and the upper resistive layer becomes, the smaller a fluctuation of resistance value becomes.

Namely, the conventional materials for the resistive layer may be used for the present invention such as carbon paste, metallic powder paste, conductive ceramics, and etc,.

Further, the conventional forming methods for resistive layers may also be applicable to the present invention.

The entire thickness of the resistive body may be selected from the range of 0.01 μm to several mm according to the use and the purpose of the resistor. The proportion between the thickness of the lower resistive layer and the upper resistive layer is preferably that when the thickness of the lower resistive layer is taken as 100, the thickness of the upper resistive layer is 10 to 1000. As the thickness of the upper resistive layer increases, the resulted resistor becomes durable. And the resistance change of the resistor increases. Herein, the upper resistive layer is preferred to have 10 times greater or more value of resistance between both ends thereof than that of the lower resistive layer.

The variable resistor of the present invention is particularly useful for a throttle sensor of the vehicles which is required to have high sliding cycles (about 10 million cycles) and a highly stable ratio of divided voltages. Also the variable resistor is used for other part of the vehicle such as for a crank angle sensor (about ten million sliding cycles) and tilt sensor, door rock sensor and other positioning sensors.

Further, the variable resistor of the present invention is useful for variable resistors used for a dimmer and motor control wherein a brush pressure is required to be a large value to flow large electric current, inevitably abrading a resistive body thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF PREFERRED EMBODIMENTS

Having generally described this invention, a further understanding can be obtained by reference to certain specific examples which are provided herein for purpose of illustration only and are not intended to be limiting unless otherwise specified.

(EMBODIMENT 1)

Figure 5:
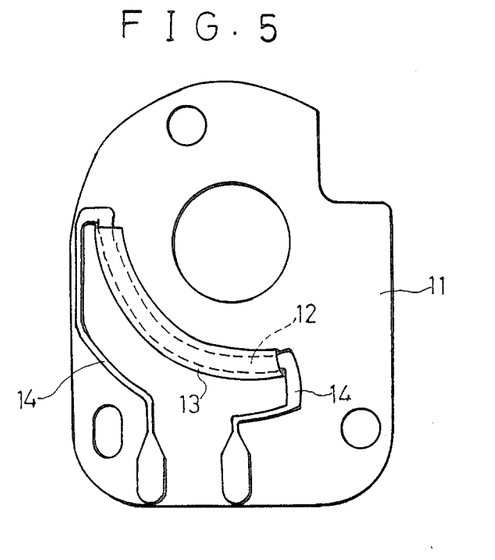
FIG. 5 shows a plan view of a substrate in a first preferred embodiment.

A substrate, shown in FIG. 5, having shaft hole in center was used. The substrate was made of a 96% alumina plate 11 (produced by NORITAKE Co. Ltd.) which is often used for thick film integrated circuit. The surface of the alumina plate 11 was printed with Ag-Pt paste (TR-4846; produced by TANAKA MATSUSEI) by screen printing into desired shape, followed by leveling process of 10 minutes long. Then the printed paste was dried for 15 minutes at 100° C. and burned. Burning condition was determined as 60 minutes process where temperature peak was kept at 850° C. for 10 minutes. Thus a pair of conductors 14 were formed on the alumina plate 11. Next, No. 1621 ruthenium oxide paste composed of 30-60 weight % of ruthenium oxide powder, 50-20 weight % of glass powder, 2-5 weight % of organic binder and 15-18 weight % of solvent (No. 1621; produced by Dupont Co.) was printed by screen printing to form a lower resistive layer 12 followed by dry and burning in the same manner as described above. Also, No. 1641 ruthenium oxide paste (No. 1641; produced by Dupont Co.) was printed by screen printing to form an upper resistive layer 13 followed by dry and burning in the same manner as described above. Herein, the upper resistive layer 13 made of No. 1621 ruthenium oxide paste had 100 times greater value of volume resistivity compared with the lower resistive layer 12 made of No. 1641 ruthenium paste.

Figure 6:
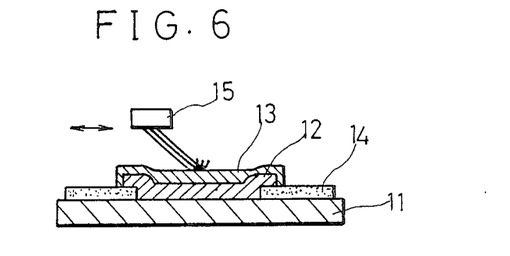
FIG. 6 shows a cross-sectional basic construction of the variable resistor in the first preferred embodiment.

Herein, the lower resistive layer 12 was 1.5 mm in width, 23 mm in length and 15 μm in thickness of arc shape, as indicated by broken line in FIG. 5. The upper resistive layer 13 entirely covering the lower resistive layer 12 was 2.0 mm in width, 23 mm in length and 15 μm in thickness. A cross-sectional basic construction of the Embodiment 1 is shown in FIG. 6. Further, a slider (not shown) was installed in the shaft hole of the alumina plate 11 in a manner that a brush 15 installed at the end of the slider was brought into contact with the surface of the upper resistive layer 13. The brush 15 was constituted of 20 fine wires.

Thus obtained variable resistor was examined for fluctuation in resistance value and ratio of divided voltages after a life test of actuation for 10 million times. The test result showed smaller fluctuation in resistance value and ratio of divided voltages compared with conventional variable resistor without the upper resistive layer 13.

(EMBODIMENT 2)

A second embodiment according to the present invention is a throttle sensor.

Figure 7:
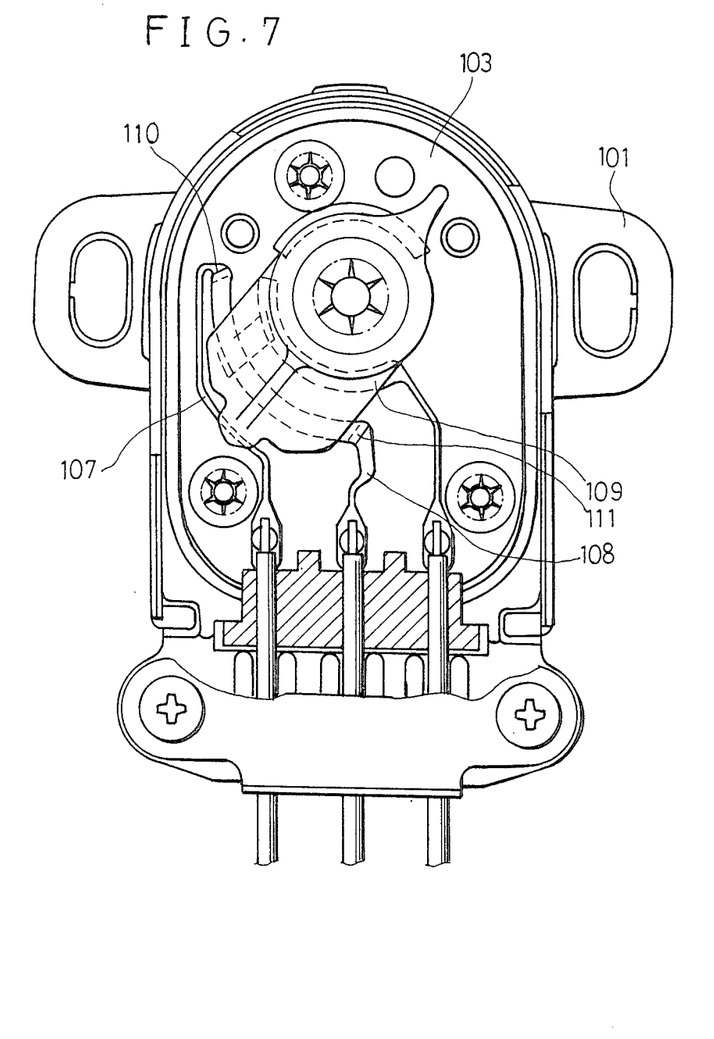
FIG. 7 shows a plan view of the throttle sensor in a second preferred embodiment.
Figure 8:
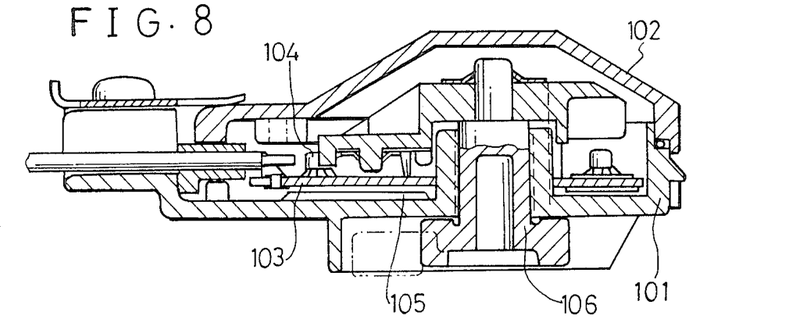
FIG. 8 shows a transverse sectional view of the throttle sensor in the second preferred embodiment.
Figure 9:
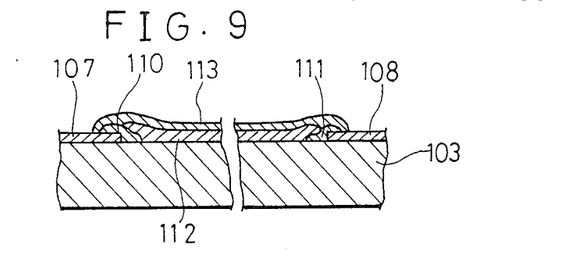
FIG. 9 shows an explanatory drawing of a basic construction of the variable resistor in the second preferred embodiment.

FIG. 7 shows a plan view of the throttle sensor wherein an upper housing is omitted. FIG. 8 is a transverse sectional view thereof. FIG. 9 shows a cross-sectional basic construction of the second embodiment.

The throttle sensor mainly comprised a lower housing 101, an upper housing 102, a substrate 103 fixed on inner bottom of the lower housing 101, and an oscillating shaft portion 106 peripherally having brushes 104 and 105 and is held rotatable in a shaft hole of the lower housing 101. The oscillating shaft portion 106 was mechanically locked to a throttle shaft (not shown) and was oscillated jointly. The substrate 103 was a copper plated glass reinforced epoxy resin plate. The epoxy plate was treated with etching process to form copper foil into three conductors 107, 108 and 109. Next, Ag paste (CLS-504J ; produced by ASAHI KAKEN) was printed at each of the end portions of the conductors 107 and 108. The paste was dried and hardened under a temperature of 170° C. for one hour. Thus connecting portions 110 and 111 were formed. Then BTU-100-5 carbon paste (BTU-100-5; produced by ASAHI KAKEN) was printed by screen printing as a lower resistive layer 112 followed by dry and hardening process under a temperature of 170° C. for one hour. Further, another BTU-10K-5 carbon paste (BTU-10K-5; produced by ASAHI KAKEN) was printed by screen printing as an upper resistive layer 113 followed by dry and hardening process under a temperature of 170° C. for one hour. Herein, the upper resistive layer 113 had about 10 times greater value of volume resistivity than the lower resistive layer 112.

Two types of carbon paste contained 30–60 weight % of carbon powder, 50–20 weight % of phenolic resin binder, 2 weight % of hardening agent and 15–18 weight % of solvent. The lower resistive layer 112 and the upper resistive layer 113 had the same shape with those of Embodiment 1, and the upper resistive layer 113 entirely covered the lower resistive layer 112. The resistance value between each end portion of the lower resistive layer 112 was 6 k.$\Omega$ and the same of the upper resistive layer 113 was 70 k.$\Omega$. When in measuring resistance value by sheet resistivity, the lower resistive layer 112 had 350$\Omega/\square$ and the upper resistive layer 113 had 3 k$\Omega/\square$. And when in measuring by volume resistivity, $\rho e$ of the lower resistive layer 112 was 0.525$\Omega$.cm and $\rho u$ of the upper resistive layer 113 was 4.5$\Omega$.cm.

The oscillating shaft of thus obtained variable resistor was mechanically oscillated, making the brush 104 oscillate upon the surface of the upper resistive layer 113. This process was repeated for 3 million times as a life test, and a rate of change in resistance value of the resistive body was measured respectively at 250 thousand times, 700 thousand times, 1.25 million times, 1.7 million times, 2 million times and 3 million times. The obtained result is indicated by blank circles in FIG. 10. On the other hand, a result of the same test as described above conducted with a variable resistor having a single resistive layer is indicated by black circles as a comparative example in FIG. 10. The variable resistor of the comparative example had a resistive body made of a single layer, that is the lower resistive layer, and did not have an upper resistive layer.

Figure 10:
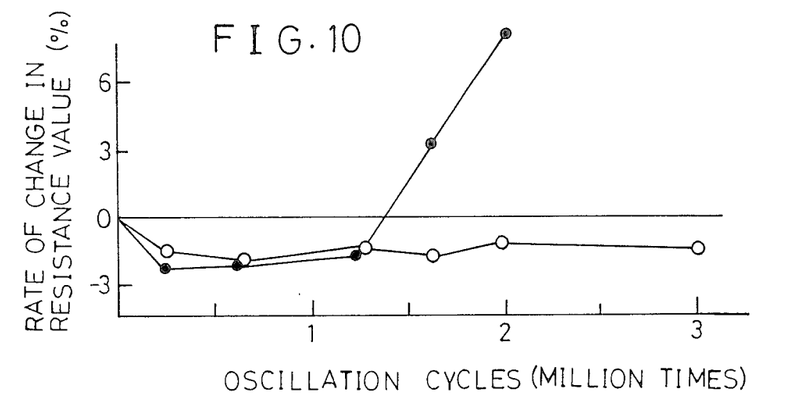
FIG. 10 shows a graph of rate of change in resistance value of a conventional variable resistor and the variable resistor of the present invention.

According to FIG. 10, the rate of change in resistance value decrease up to 250 thousand times oscillation, considerably because of slight approaches of carbon particles to each other which harden carbon paste used for the resistive layers and make the resistance value decrease.

As shown in FIG. 10, in the comparative example having the lower resistive layer only, the rate of change in resistance value increase rapidly when the oscillation exceeds 1.25 million times. However, the rate of change in resistance value of the resistor according to the present invention scarcely vary.

The variable resistor according to the present invention has two-layered resistive body, wherein material used for the upper resistive layer has larger volume resistivity than that of the lower resistive layer. Accordingly, even when the upper resistive layer is abraded uniformly or sectionally, the resistance value of the resistor is decided essentially by the resistance value of the lower resistive layer. Namely, the resistance value of the resistor itself varies in a little extent.

Further, by virtue of two-layered resistive body, combinations of material for resistive layers can be selected variously, enabling use of material having abrasion resistance property for the upper resistive layer. For instance, among thick film resistive materials which comprise ruthenium oxide as a main component, material containing much glass have higher volume resistivity and higher abrasion resistance property. However, when a variable resistor with low resistance value is required, material having low volume resistivity have been preferentially used despite of its low abrasion resistance property. The two-layered resistive body of the present invention can overcome above-said disadvantage and provide a variable resistor having both of abrasion resistance property and low volume resistivity.

Further, conventional variable resistor has another disadvantage in fluctuation of resistance value caused by deformation of the resistor surface by virtue of oxidation, deoxidation or the like, when used under circumstance of high temperature for long time. However, in the two-layered resistive body of the present invention, only the surface of the upper resistive layer having higher volume resistivity is deformed by oxidation or deoxidation. Accordingly, fluctuation in the resistance value and ratio of divided voltages can be quite small.

Having now fully described the invention, it will be apparent to one of ordinary skill in the art that many changes and modifications can be made thereto without departing from the spirit or scope of the invention as set forth herein.

What is claimed is:

1. A variable resistor, comprising:
   a substrate formed from a copper-plated laminated plate in which the copper plate forms an etched wiring and soldered part;
   a lower resistive layer formed on the surface of said substrate;
   an upper resistive layer formed on said lower resistive layer, the volume resistivity of which being in a range of 2 to 500 times greater than the volume resistivity of said lower resistive layer; and
   a brush sliding on the surface of said upper resistive layer.

2. A variable resistor according to claim 1, wherein the electrical bond between said copper and said lower resistive layer is formed of conductive paste containing particles of silver.

3. A variable resistor according to claim 2, wherein said conductive paste containing particles of silver is placed on said copper-plate and contacts said substrate, said lower resistive layer being formed thereon.

4. A variable resistor according to claim 2, wherein said resistive paste contains 60–80 weight % of silver powder, 0 to 15 weight % of resin and 16 to 20 weight % of solvent.

5. A variable resistor according to claim 2, wherein said conductive paste containing particles of silver is printed and heat hardened on said copper-plated laminated plate treated with etching process, before said lower resistive layer is printed and heat hardened thereon.

* * * * *

UNITED STATES PATENT AND TRADEMARK OFFICE
CERTIFICATE OF CORRECTION

PATENT NO. : 4,751,492

DATED : JUNE 14, 1988

INVENTOR(S) : TAKAYOSHI TSUZUKI ET AL

It is certified that error appears in the above-identified patent and that said Letters Patent is hereby corrected as shown below:

Column 1, line 60, delete "as;" and insert therefor --as:--.

Column 1, line 64, delete ">" (second occurrence).

Column 1, line 65, delete "l1" and insert therefor --r1--.

Column 1, line 68, after "r1" insert --.--.

Column 2, line 11, delete "r1" and insert therefor --$r_1$--.

Column 2, line 13, delete "ru" and insert therefor --$r_u$--.

Column 2, line 18, delete "rc" and insert therefor --$r_c$--.

Column 2, line 44, after "formed" insert --on--.

Column 2, line 50, delete "electrode" and insert therefor --electrodes--.

Column 2, line 57, delete "resitivity" and insert therefor --resistivity--.

UNITED STATES PATENT AND TRADEMARK OFFICE
CERTIFICATE OF CORRECTION

PATENT NO. : 4,751,492
DATED : MAY 14, 1988
INVENTOR(S) : TAKAYOSHI TSUZUKI ET AL

It is certified that error appears in the above-identified patent and that said Letters Patent is hereby corrected as shown below:

Column 2, line 57, delete "$\rho e$" and insert therefor --$\rho_1$--.

Column 2, line 58, delete "$\rho u$" and insert therefor --$\rho_u$--.

Column 2, line 59, delete "$\rho e$ and $\rho u$" and insert therefor --$\rho_1$ and $\rho_u$--.

Column 2, line 61, delete "the".

Column 2, line 62, after "$2 \times 10^2)$" insert --,--.

Column 2, line 68, delete "portion" and insert therefor --proportion--.

Column 3, line 6, delete "etc,." and insert therefor --etc.--.

Column 3, line 27, delete "part" and insert therefor --parts--.

Column 3, line 45, delete "explanatroy" and insert therefor --explanatory--.

Column 4, line 24, delete "were" and insert therefor --was--.

UNITED STATES PATENT AND TRADEMARK OFFICE
CERTIFICATE OF CORRECTION

PATENT NO. : 4,751,492

DATED : JUNE 14, 1988

INVENTOR(S) : TAKAYOSHI TSUZUKI ET AL

It is certified that error appears in the above-identified patent and that said Letters Patent is hereby corrected as shown below:

Column 4, line 31, delete "dry" and insert therefor --drying--.

Column 4, line 34, delete "dry" and insert therefor --drying--.

Column 5, line 16, delete "dry" and insert therefor --a drying--.

Column 5, line 20, delete "dry" and insert therefor --a drying--.

Column 5, line 37, delete "$\rho e$" and insert therefor --$\rho_1$--.

Column 5, line 38, delete "$\Omega.cm$" and insert therefor --$\Omega \cdot cm$--.

Column 5, line 38, delete "Pu" and insert therefor --$P_u$--.

Column 5, line 39, delete "$\Omega.cm$" and insert therefor --$\Omega \cdot cm$--.

Column 5, line 56, delete "decrease" and insert therefor --decreases--.

UNITED STATES PATENT AND TRADEMARK OFFICE
CERTIFICATE OF CORRECTION

PATENT NO. : 4,751,492

DATED : JUNE 14, 1988

INVENTOR(S) : TAKAYOSHI TSUZUKI ET AL

It is certified that error appears in the above-identified patent and that said Letters Patent is hereby corrected as shown below:

Column 5, line 63, delete "increase" and insert therefor --increases--.

Column 5, line 66, delete "vary" and insert therefor --varies--.

Column 6, line 7, delete "in" and insert therefor --to--.

Column 6, lines 13-14, delete "material" and insert therefor --materials--.

Column 6, line 18, delete "of its" and insert therefor --their--.

Column 6, line 21, delete "of".

Column 6, line 27, after "for" insert --a--.

Signed and Sealed this

Fourteenth Day of February, 1989

Attest:

DONALD J. QUIGG

*Attesting Officer*  *Commissioner of Patents and Trademarks*